United States Patent
Tokuda

(10) Patent No.: US 11,476,810 B2
(45) Date of Patent: Oct. 18, 2022

(54) RADIO-FREQUENCY CIRCUIT

(71) Applicant: Murata Manufacturing Co., Ltd., Kyoto (JP)

(72) Inventor: Masamichi Tokuda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 39 days.

(21) Appl. No.: 17/014,342

(22) Filed: Sep. 8, 2020

(65) Prior Publication Data
US 2020/0403581 A1 Dec. 24, 2020

Related U.S. Application Data

(63) Continuation of application No. PCT/JP2019/008708, filed on Mar. 5, 2019.

(30) Foreign Application Priority Data

Mar. 9, 2018 (JP) .............................. JP2018-043355

(51) Int. Cl.
*H03F 1/56* (2006.01)
*H03F 3/24* (2006.01)

(52) U.S. Cl.
CPC ............... *H03F 1/56* (2013.01); *H03F 3/245* (2013.01); *H03F 2200/222* (2013.01);
(Continued)

(58) Field of Classification Search
CPC ............. H03F 3/68; H03F 3/191; H03F 3/193
(Continued)

(56) References Cited

U.S. PATENT DOCUMENTS 4,887,005 A * 12/1989 Rough .............. H01J 37/32082
315/111.21
2004/0092245 A1 5/2004 Katz
(Continued)

FOREIGN PATENT DOCUMENTS

JP 2002064353 A 2/2002
JP 2004159342 A 6/2004
(Continued)

OTHER PUBLICATIONS

International Search Report issued in Application No. PCT/JP2019/008708, dated May 28, 2019.
(Continued)

*Primary Examiner* — Hieu P Nguyen
(74) *Attorney, Agent, or Firm* — Pearne & Gordon LLP

(57) ABSTRACT

A radio-frequency circuit includes: an amplifier; a matching circuit connected to an output side of the amplifier; and a power splitter connected to an output side of the matching circuit. The power splitter includes a differential inductor and a resistor element. The differential inductor includes an input node (ni), a first line, and a second line. The input node (ni) is connected to the matching circuit. The first line and the second line are respectively wound into coil form and connected to the input node (ni). The resistor element forms a connection between a node (n1) on an output side of the first line and a node (n2) on an output side of the second line. The first line and the second line are wound in opposite directions and have the same coil axis.

20 Claims, 5 Drawing Sheets

(52) U.S. Cl.
CPC .. *H03F 2200/294* (2013.01); *H03F 2200/387* (2013.01); *H03F 2200/451* (2013.01)

(58) Field of Classification Search
USPC .................. 330/295, 301–302, 311, 307
See application file for complete search history.

(56) References Cited

U.S. PATENT DOCUMENTS

| | | |
|---|---|---|
| 2007/0184811 A1 | 8/2007 | Ballantyne |
| 2009/0096527 A1 | 4/2009 | Ishiguro |
| 2011/0316636 A1 | 12/2011 | Zhao et al. |
| 2017/0201218 A1* | 7/2017 | Wang .................... H03F 1/565 |

FOREIGN PATENT DOCUMENTS

| | | | |
|---|---|---|---|
| JP | 2007295146 A | 11/2007 |
| JP | 2010010344 A | 1/2010 |
| JP | 2011151771 A | 8/2011 |
| JP | 2012170121 A | 9/2012 |
| JP | 2016189592 A | 11/2016 |

OTHER PUBLICATIONS

Written Opinion issued in Application No. PCT/JP2019/008708, dated May 28, 2019.

* cited by examiner

RADIO-FREQUENCY CIRCUIT

This is a continuation of International Application No. PCT/JP2019/008708 filed on Mar. 5, 2019 which claims priority from Japanese Patent Application No. 2018-043355 filed on Mar. 9, 2018. The contents of these applications are incorporated herein by reference in their entireties.

BACKGROUND

Technical Field

The present disclosure relates to a radio-frequency circuit including an amplifier and a power splitter.

Radio-frequency circuits including amplifiers are typically used as components of communication devices incorporated in, for example, mobile terminals. Such a radio-frequency circuit is described in, for example, Patent Document 1. The radio-frequency circuit concerned includes: a low noise amplifier (LNA) that amplifies a radio-frequency input signal; and a power splitter that splits a signal output by the LNA into two output signals. Patent Document 2 describes a power splitter circuit that splits a radio-frequency input signal into two signals, which are transmitted through two respective paths and are then output through inductors on the respective paths.

Patent Document 1: Japanese Unexamined Patent Application Publication No. 2012-170121

Patent Document 2: Japanese Unexamined Patent Application Publication No. 2002-64353

BRIEF SUMMARY

The radio-frequency circuit described in Patent Document 1 splits a signal output by the LNA into two output signals by using a plurality of resistors, in which a significant amount of signal power may be lost. The loss of power in the radio-frequency circuit described in Patent Document 1 may be reduced by replacing the power splitter of the radio-frequency circuit described in Patent Document 1 with the power splitter circuit described in Patent Document 2. However, this configuration requires two or more inductors in the power splitter circuit, which in turn has a large footprint. The radio-frequency circuit may thus be large in size.

The present disclosure minimizes signal power loss in a radio-frequency circuit including an amplifier and a power splitter and to miniaturize the radio-frequency circuit.

A radio-frequency circuit according to an aspect of the present disclosure includes: an amplifier; a matching circuit connected to an output side of the amplifier; and a power splitter connected to an output side of the matching circuit. The power splitter includes a differential inductor and a resistor element. The differential inductor includes an input node, a first line, and the second line. The input node is connected to the matching circuit. The first and second lines are respectively wound into coil form and connected to the input node. The resistor element forms a connection between a node on an output side of the first line and a node on an output side of the second line. The first and second lines are wound in opposite directions and have the same coil axis.

The power splitter thus eliminates the need to include resistors and enables minimization of signal power loss in the radio-frequency circuit accordingly.

The first and second lines are wound in opposite directions and have the same coil axis. Owing to this feature, the first and second lines may be close to each other, and the inductor included in the power splitter may have a small footprint accordingly. The radio-frequency circuit may thus be small in size.

The first and second lines may include at least one cross portion where the first and second lines cross each other.

The cross portion where the first and second lines cross each other enables the first and second lines to be closer to each other, and the inductor included in the power splitter may have a small footprint accordingly. The radio-frequency circuit may thus be small in size.

The amplifier, the matching circuit, and the power splitter may be integrated into a semiconductor integrated circuit.

A further reduction in the size of the radio-frequency circuit may thus be achieved.

A radio-frequency load may be connected to an output side of the power splitter. An impedance seen looking toward an input side of the power splitter from the output side of the matching circuit may be a parallel impedance constituted of an impedance seen looking toward the radio-frequency load from the output side of the first line of the power splitter and an impedance seen looking toward the radio-frequency load from the output side of the second line of the power splitter and may be matched to an impedance seen looking toward the output side of the matching circuit from the input side of the power splitter.

When the impedance seen looking toward the input side of the power splitter from the output side of the matching circuit and the impedance seen looking toward the output side of the matching circuit from the input side of the power splitter are matched to the value of the parallel impedance constituted of the impedance seen looking toward the radio-frequency load from the output side of the first line of the power splitter and the impedance seen looking toward the radio-frequency load from the output side of the second line of the power splitter, impedance matching between the amplifier and the power splitter may be provided without necessarily the need for an additional matching circuit for use in matching these impedances to the value of the parallel impedance. A further reduction in the size of the radio-frequency circuit may thus be achieved.

The radio-frequency circuit may also include: a bypass circuit that bypasses the amplifier and the matching circuit and includes a first switch and an attenuator; and a second switch; and a third switch. The first switch and the attenuator are arranged in series on a path connecting a node (seventh node) on an input side of the amplifier to a node (eighth node) on an input side of the power splitter. The first switch is connected to the node on the input side of the amplifier. The attenuator is connected to the node on the input side of the power splitter. On a path on which the bypass circuit is disposed, the second switch is connected between the attenuator and the node on the input side of the power splitter. On a path on which the amplifier and the matching circuit are disposed, the third switch is connected between the matching circuit and the node on the input side of the power splitter. An impedance (fifth impedance) seen looking toward the input side of the power splitter from an output side of the attenuator may be matched to an impedance (sixth impedance) seen looking toward the output side of the attenuator from the input side of the power splitter.

When the impedance seen looking toward the input side of the power splitter from the output side of the attenuator is matched to the impedance seen looking toward the output side of the attenuator from the input side of the power splitter, the attenuator may be used as an impedance matching circuit that provides impedance matching between the bypass circuit and the power splitter. Such an attenuator typically included in a bypass circuit may be used to provide impedance matching between the bypass circuit and the power splitter without necessarily the need for an additional matching circuit. A further reduction in the size of the radio-frequency circuit may thus be achieved.

When the impedance seen looking toward the input side of the power splitter from the output side of the attenuator and the impedance seen looking toward the output side of the attenuator from the input side of the power splitter are matched to the value of the parallel impedance constituted of the impedance seen looking toward the radio-frequency load from the output side of the first line of the power splitter and the impedance seen looking toward the radio-frequency load from the output side of the second line of the power splitter, impedance matching between the bypass circuit and the power splitter may be provided without necessarily the need for an additional matching circuit for use in matching these impedances to the value of the parallel impedance. A further reduction in the size of the radio-frequency circuit may thus be achieved.

When the matching circuit provides impedance matching between the amplifier and the power splitter, the second switch between the power splitter and the attenuator may be used to disrupt electrical continuity between the power splitter and the attenuator. The impedance matching between the amplifier and the power splitter may be further facilitated accordingly. When the attenuator provides impedance matching between the bypass circuit and the power splitter, the third switch between the power splitter and the matching circuit may be used to disrupt electrically continuity between the power splitter and the matching circuit. The impedance matching between the bypass circuit and the power splitter may be further facilitated accordingly.

The radio-frequency circuit may also include a voltage input terminal through which voltage is applied to the amplifier. The matching circuit may include: a plurality of capacitors arranged in series on a path connecting the amplifier to the power splitter; and a plurality of inductors connected between the amplifier and the voltage input terminal and connected in parallel to the voltage input terminal. One of the plurality of inductors, a first inductor, may be connected to a node (fifth node) located between the amplifier and one of the plurality of capacitors that is closer than any other capacitor to the amplifier. Another one of the plurality of inductors, a second inductor, may be connected to a node (sixth node) located between adjacent ones of the plurality of capacitors.

That is, the matching circuit includes a plurality of impedance elements (e.g., inductors or capacitors) connected in parallel to the voltage input terminal. The matching circuit can thus provide impedance matching over a wider frequency range, and the radio-frequency circuit may be adapted to a wider band accordingly. Unlike a matching circuit including one inductor, the matching circuit configured as described above can provide impedance matching without necessarily the need to reduce the value of inductance and thus eliminates or reduces the possibility that the gain of the amplifier will be lowered.

The amplifier may be a low noise amplifier.

Signals may be amplified by the low noise amplifier with minimized power loss. Furthermore, the radio-frequency circuit including the low noise amplifier may be small in size.

The present disclosure enables minimization of signal power loss in a radio-frequency circuit including an amplifier and a power splitter and miniaturization of the radio-frequency circuit.

DETAILED DESCRIPTION

Figure 1:
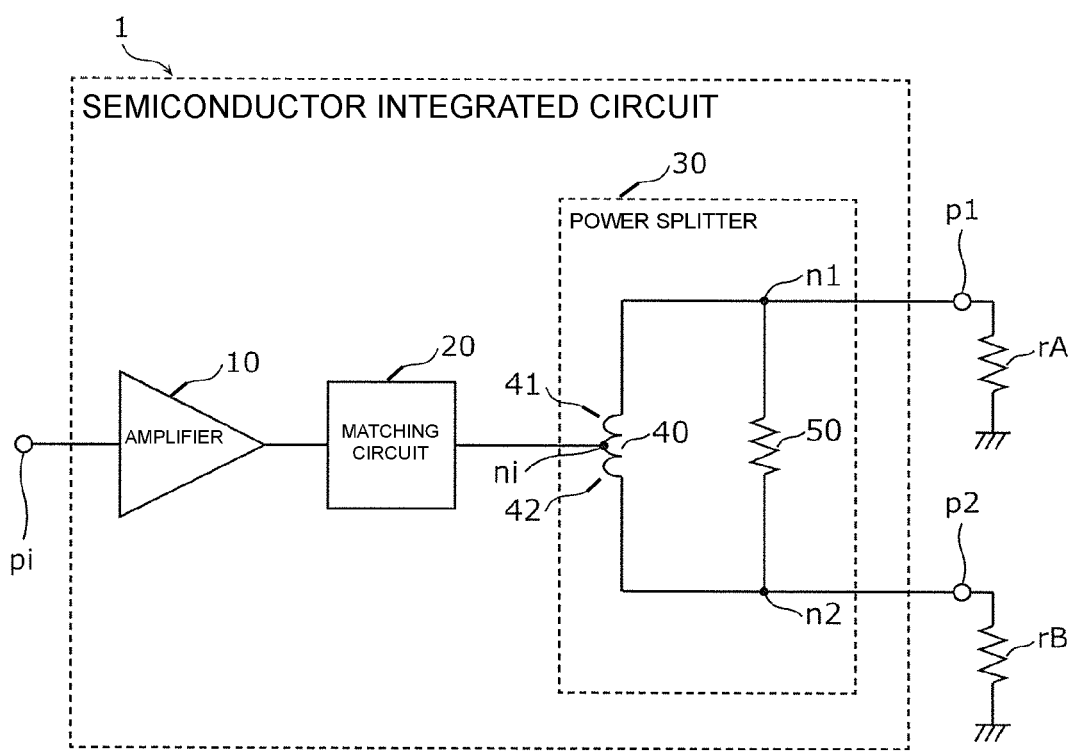
FIG. 1 is a circuit configuration diagram of a radio-frequency circuit according to Embodiment 1.

Hereinafter, the present disclosure will be described in detail by way of embodiments with reference to the accompanying drawings. The following embodiments are general or specific examples. Details, such as values, shapes, materials, constituent components, and arrangements and connection patterns of the constituent components in the following embodiments are provided merely as examples and should not be construed as limiting the present disclosure. Of the constituent components in the following embodiments, those not mentioned in independent claims are described as optional constituent components. The sizes and the relative proportions of the constituent components illustrated in the drawings are not necessarily to scale.

Embodiment 1

A radio-frequency circuit 1 according to the present embodiment is, for example, a circuit in which a radio-frequency signal including a plurality of bands is amplified and power of the resultant signal is split to obtain two output signals. The bands may include the 5 GHz band for WiFi (registered trademark), the 5 GHz band for Licensed-Assisted Access using LTE (LAA), the 2 GHz band for WiFi, and bands for Bluetooth (registered trademark).

[Circuit Configuration of Radio-Frequency Circuit]

The following describes the radio-frequency circuit 1 according to Embodiment 1 with reference to FIG. 1. FIG. 1 is a circuit configuration diagram of the radio-frequency circuit 1 according to Embodiment 1.

The radio-frequency circuit 1 includes an amplifier 10, a matching circuit 20, and a power splitter 30. The radio-frequency circuit 1 is provided with an input port pi, a first output port p1, and a second output port p2. Radio-frequency signals are input through the input port pi, are transmitted through the amplifier 10, the matching circuit 20, and the power splitter 30, and are then output through the first output port p1 or the second output port p2.

The input side of the amplifier 10 is connected to the input port pi through wiring. The amplifier 10 amplifies radio-frequency signals input through the input port pi and outputs resultant signals. The amplifier 10 is, for example, a low-noise amplifier (LNA).

The matching circuit 20 is connected to the output side of the amplifier 10. The matching circuit 20 provides impedance matching between the amplifier 10 and the power splitter 30. The matching circuit 20 includes matching elements, such as an inductor and a capacitor.

The power splitter 30 is connected to the output side of the matching circuit 20. The power splitter 30 splits power of a signal output by the matching circuit 20 and outputs resultant two output signals. Each of the resultant two signals is output through the corresponding one of the first output port p1 and the second output port p2. As illustrated in the drawing, at least one radio-frequency load is connected to the output side of the power splitter 30; that is, a radio-frequency load rA and a radio-frequency load rB are connected to the first output port p1 and the second output port p2, respectively. Examples of the at least one radio-frequency load include a filter, an amp, an attenuator, a radio-frequency switch, an inductor, a capacitor, a resistor, an RF signal processing circuit, and a baseband signal processing circuit. Resistors connected to the output side of the power splitter 30 in FIG. 1 are examples of the radio-frequency loads rA and rB. The radio-frequency loads rA and rB are not necessarily included in the radio-frequency circuit 1 as constituent components of the radio-frequency circuit 1.

The power splitter 30 includes a differential inductor 40 and a resistor (first resistor) 50.

The differential inductor 40 includes an input node ni, a first line 41, and a second line 42. The input node ni is connected to the matching circuit 20, and the first line 41 and the second line 42 are respectively wound into coil form and connected to the input node ni. The first line 41 and the second line 42 are wound in opposite directions and have the same coil axis.

One end of the first line 41 is connected to the input node ni, and the other end of the first line 41 is connected to a first node n1, which is on the output side of the first line 41. The first node n1 is located between an output end of the first line 41 and the first output port p1.

One end of the second line 42 is connected to the input node ni, and the other end of the second line 42 is connected to a second node n2, which is on the output side of the second line 42. The second node n2 is located between an output end of the second line 42 and the second output port p2. The first node n1 and the second node n2 may be hereinafter also referred to as a node n1 and a node n2, respectively.

The resistor (resistor element) 50 is disposed between the node n1 and the node n2 to form a connection between the node n1 and the node n2. The resistor element 50 is disposed to provide isolation between a signal output through the first output port p1 and a signal output through the second output port p2. When, for example, the impedance at each of the nodes n1 and n2 is 50Ω, the resistance value of the resistor element 50 may be 100Ω, which is twice the impedance at each of the nodes n1 and n2.

As mentioned above, the power splitter 30 of the radio-frequency circuit 1 according to the present embodiment includes the differential inductor 40 and the resistor element 50. A disadvantage of the technique known in the art is that a signal can suffer a loss of about 6 dB as the power of the signal is split by using a plurality of resistor elements. As a workaround, an inductor is used to split signal power in the radio-frequency circuit 1 according to the present embodiment. The loss of signal power in the radio-frequency circuit 1 may be reduced to about 3 dB accordingly.

In the radio-frequency circuit 1, the impedance (first impedance) seen looking toward the input side of the power splitter 30 from the output side of the matching circuit 20 is smaller than a first output-side impedance (second impedance) seen looking toward the radio-frequency load rA from the output side of the first line 41 of the power splitter 30 or is smaller than a second output-side impedance (third impedance) seen looking toward the radio-frequency load rB from the output side of the second line 42 of the power splitter 30. The reason is that the impedance seen looking toward the input side of the power splitter 30 from the output side of the matching circuit 20 is a parallel impedance that is a combined impedance constituted of the first output-side impedance and the second output-side impedance.

When, for example, the first output-side impedance and the second output-side impedance are substantially on the same level, the impedance seen looking toward the input side of the power splitter 30 from the output side of the matching circuit 20 is about half the first output-side impedance or is about half the second output-side impedance. Specifically, when the first output-side impedance seen looking toward the radio-frequency load rA from the node n1 or the second output-side impedance seen looking toward the radio-frequency load rB from the node n2 is 50Ω, the impedance seen looking toward the input node ni from the output side of the matching circuit 20 is 25Ω. The first line 41 and the second line 42 are each assumed to be a line having no inductor component because their magnetic fields cancel each other out. For this reason, the impedance seen looking toward the input node ni from the output side of the matching circuit 20 is the parallel impedance constituted of the first output-side impedance and the second output-side impedance of the power splitter 30.

In the radio-frequency circuit 1, the impedance (fourth impedance) seen looking toward the output side of the matching circuit 20 from the input side of the power splitter 30 is matched to the impedance seen looking toward the input side of the power splitter 30 from the output side of the matching circuit 20. The impedance seen looking toward the input side of the power splitter 30 from the output side of the matching circuit 20 is, for example, 25Ω. In this case, the impedance seen looking toward the output side of the matching circuit 20 from the input side of the power splitter 30 is 25Ω.

As mentioned above, a feature of the present embodiment is that the impedance seen looking toward the input side of the power splitter 30 from the output side of the matching circuit 20 and the impedance seen looking toward the output side of the matching circuit 20 from the input side of the power splitter 30 are matched to the value of the parallel impedance constituted of the first output-side impedance seen looking toward the radio-frequency load rA from the output side of the first line 41 of the power splitter 30 and the second output-side impedance seen looking toward the radio-frequency load rB from the output side of the second line 42 of the power splitter 30.

As for a commonly-used power splitter including no differential inductor, the input-side impedance of the power splitter is substantially on the same level with each of the output-side impedances. Thus, a matching circuit is disposed between an amplifier and the power splitter to match the input-side impedance to the value of each of the output-side impedances of the power splitter. However, impedance matching for a power splitter including a differential inductor may not be fully accomplished by such a matching circuit alone. The reason is that the input-side impedance of the power splitter including a differential inductor is a parallel impedance constituted of the output-side impedances and is thus lower than each of the output-side impedances. It is required that a separate matching circuit for use in matching the impedances to the value of the parallel impedance be disposed in order to provide impedance matching between the amplifier and the power splitter.

Meanwhile, the matching circuit 20 in the present embodiment matches the impedances to the value of the parallel impedance. Owing to this feature, the impedance matching between the amplifier 10 and the power splitter 30 may be provided without necessarily the need for an additional matching circuit for use in matching the impedances to the value of the parallel impedance. The radio-frequency circuit 1 may thus be small in size.

As illustrated in FIG. 1, the amplifier 10, the matching circuit 20, and the power splitter 30 of the radio-frequency circuit 1 may be incorporated in a semiconductor integrated circuit. In this case, the input port pi, the first output port p1, and the second output port p2 are, for example, external terminals connected to a mounting substrate. The semiconductor integrated circuit may also incorporate electronic components other than the amplifier 10, the matching circuit 20, and the power splitter 30.

[Structure of Radio-Frequency Circuit]

The structure of the radio-frequency circuit 1 will be described below with reference to FIGS. 1 and 2.

The following describes the structure of the power splitter 30 in an integrated circuit. FIG. 2 illustrates the power splitter 30 of the radio-frequency circuit 1. FIG. 2 is a see-through plan view of the power splitter 30, illustrating the first line 41 and the second line 42 in the direction in which layers of the power splitter 30 are stacked on one another as will be described later.

As mentioned above, the power splitter 30 includes the differential inductor 40 and the resistor element 50.

Figure 2:
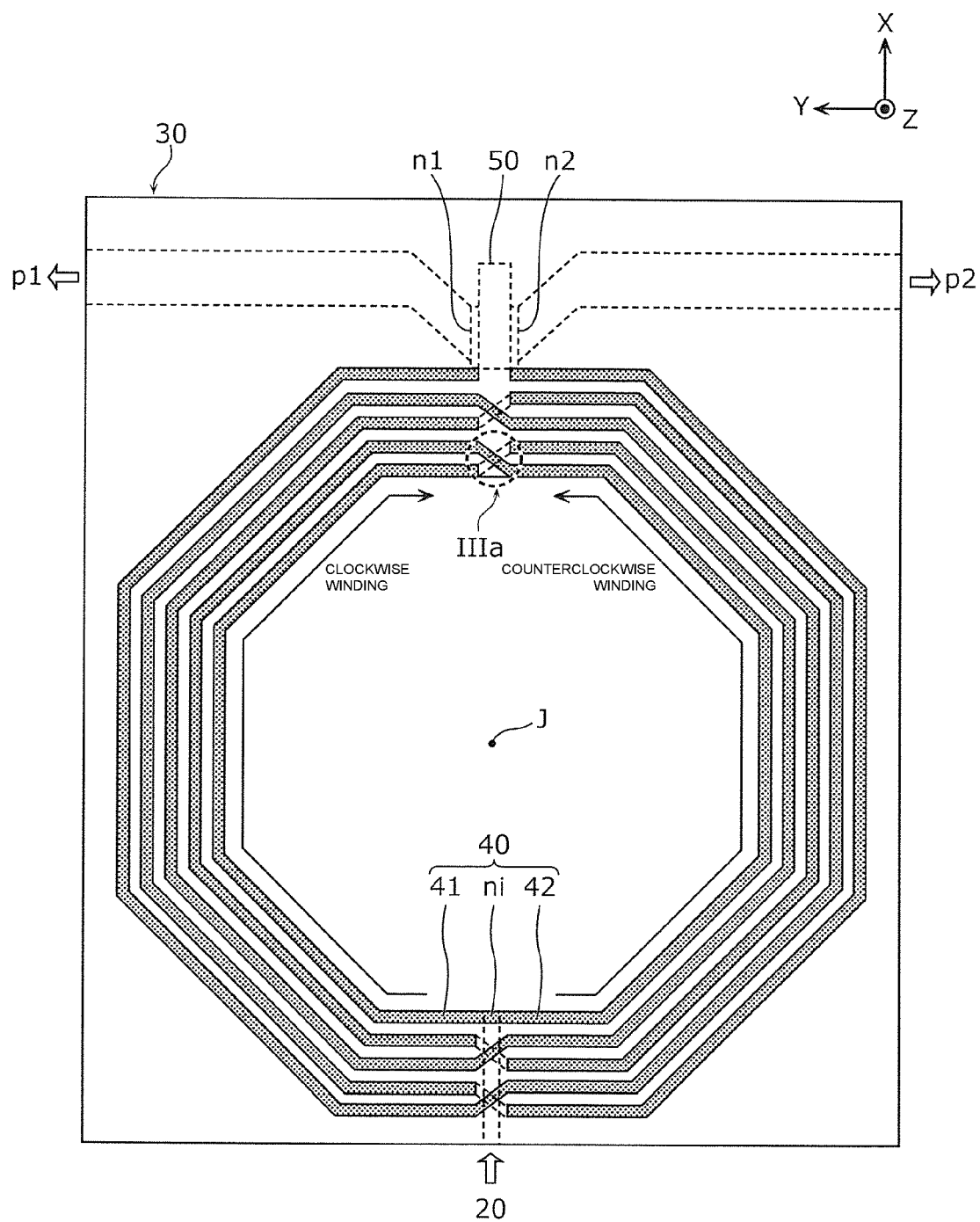
FIG. 2 illustrates a power splitter of the radio-frequency circuit according to Embodiment 1.

Referring to FIG. 2, the differential inductor 40 includes: the input node ni located on the signal input side; and the first line 41 and the second line 42 respectively wound in coil form and connected to the input node ni. The first line 41 and the second line 42 are formed from a conductive material.

One end of the first line 41 is connected to the input node ni, and the other end of the first line 41 is connected to the node n1 located on the output side of the first line 41. One end of the second line 42 is connected to the input node ni, and the other end of the second line 42 is connected to the node n2 located on the output side of the second line 42.

The first line 41 and the second line 42 are wound in opposite directions and have the same coil axis, namely, a coil axis J. When viewed as in FIG. 2, the first line 41 is wound clockwise about the coil axis J, and the second line 42 is wound counterclockwise about the coil axis J. The number of winding turns of each of the first line 41 and the second line 42 is 2.5. The number of winding turns of each of the first line 41 and the second line 42 may be any value equal to or greater than 0.5. The expression "have the same coil axis (the coil axis J)" herein means that it is only required that the coil axis of the first line 41 and the coil axis of the second line 42 substantially coincide with each other. A tolerable misalignment may be produced between the coil axis J of the first line 41 and the coil axis J of the second line 42 due to, for example, unit-to-unit variation.

When viewed in plan, each of the first line 41 and the second line 42 is a scroll-shaped coil. With each line being wound from the input node ni toward the node n1 or the node n2, the perimeter of each coil increases in a stepwise manner. At least part of the first line 41 and at least part of the second line 42 adjoin each other and are arranged in parallel. For example, a 0th-to-0.5th turn section of the first line 41 and a 0.5th-to-1st turn section of the second line 42 adjoin each other and are arranged in parallel. Similarly, the 0.5th-to-1st turn section of the second line 42 and a 1st-to-1.5th turn section of the first line 41 adjoin each other and are arranged in parallel.

The length of a path extending from the node n1 through the first line 41 and the second line 42 to the node n2 is half the wavelength λ. The first line 41 and the second line 42 are of the same length, which is equal to λ/4. The first line 41 and the second line 42 are arranged symmetrically about a straight line connecting the coil axis J to the input node ni. This structure enables the first line 41 and the second line 42 between the node n1 and the node n2 to form a continuous coil whose winding direction is reversed at the input node ni.

The resistor element 50 forms a connection between the node n1 and the node n2 and is, for example, polysilicon resistor.

Figure 3:
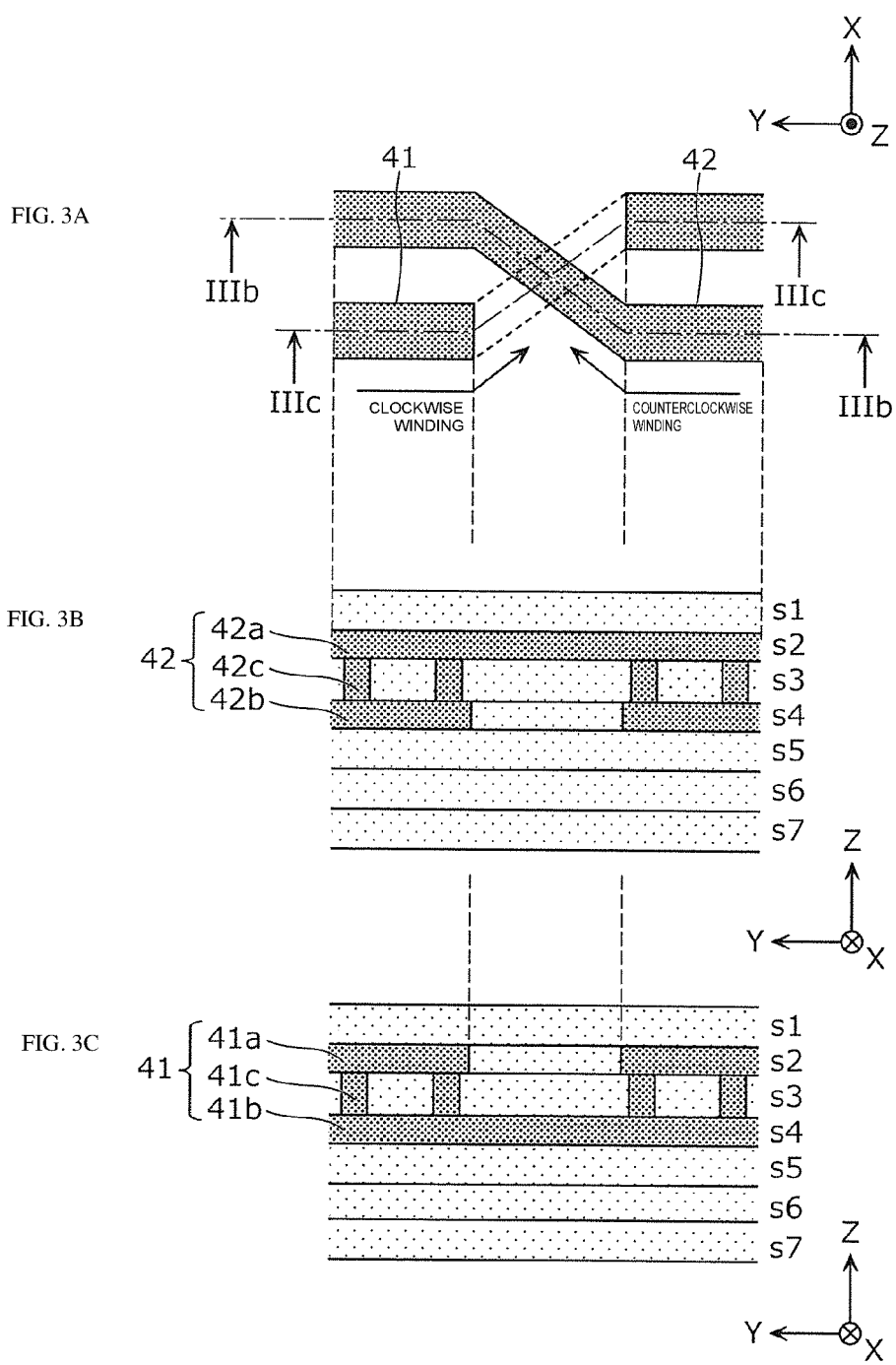
FIG. 3A is an enlarged view of the part IIIa of the power splitter of the radio-frequency circuit according to Embodiment 1 shown in FIG. 2.
FIG. 3B is a cross-sectional view cut in the line IIIb-IIIb shown in FIG. 3A.
FIG. 3C is a cross-sectional view cut in the line IIIc-IIIc shown in FIG. 3A.

Referring to FIGS. 3A to 3C, the following describes the structure of a cross portion IIIa, where the first line 41 and the second line 42 cross each other. FIGS. 3A to 3C are enlarged views of part of the power splitter 30. Specifically, FIG. 3A is an enlarged view of the cross portion IIIa illustrated in FIG. 2. FIG. 3B is a sectional view of the cross portion IIIa taken along line IIIb-IIIb in FIG. 3A. FIG. 3C is a sectional view of the cross portion IIIa taken along line IIIc-IIIc in FIG. 3A.

Referring to FIG. 3B and FIG. 3C, the power splitter 30 is constituted of layers s1, s2, s3, s4, s5, s6, and s7, which are stacked on one another. The layers s1 to s7, each includes an insulating material as a base material. The first line 41 and the second line 42, which are conductor layers, are included in designated ones of the layers s1 to s7. The input node ni, the node n1, the node n2, and the resistor element 50 are included in the layer s6 and are connected to lines lying in the upper layers.

Referring to FIG. 3C, the first line 41 includes an upper line 41a in the layer s2, a lower line 41b in the layer s4, and a via conductor 41c in the layer s3. The via conductor 41c forms a connection between the upper line 41a and the lower line 41b. Referring to FIG. 3B, the second line 42 includes an upper line 42a in the layer s2, a lower line 42b in the layer s4, and a via conductor 42c in the layer s3. The via conductor 42c forms a connection between the upper line 42a and the lower line 42b.

The first line 41 and the second line 42, each has a double-line structure. The upper line 41a is eliminated from the first line 41 in the cross portion IIIa, where the first line 41 includes only the lower line 41b. The lower line 42b is eliminated from the second line 42 in the cross portion IIIa, in which the second line 42 includes only the upper line 42a. The first line 41 and the second line 42 can thus cross each other in the cross portion IIIa without necessarily being in contact with each other. The power splitter 30 having such a structure may be formed in a semiconductor process.

A disadvantage of the technique known in the art and involving the use of inductors for outputting signals is that the power splitter has a large footprint. A feature of the radio-frequency circuit 1 according to the present embodiment is that the first line 41 and the second line 42 are wound in opposite directions and have the same coil axis. Owing to this feature, the first line 41 and the second line 42 may be close to each other, and the differential inductor 40 may thus have a small footprint. The radio-frequency circuit 1 according to the present embodiment thus offers an improvement, in terms of size reduction, over the radio-frequency circuit according to the technique known in the art.

The first line 41 and the second line 42 of the differential inductor 40 include at least one cross portion IIIa, where the first line 41 and the second line 42 cross each other. Owing to this feature, the first line 41 and the second line 42 may be close to each other, and the footprint of the differential inductor 40 may be further reduced accordingly. A further reduction in the size of the radio-frequency circuit 1 according to the present embodiment may thus be achieved.

Embodiment 2

Figure 4:
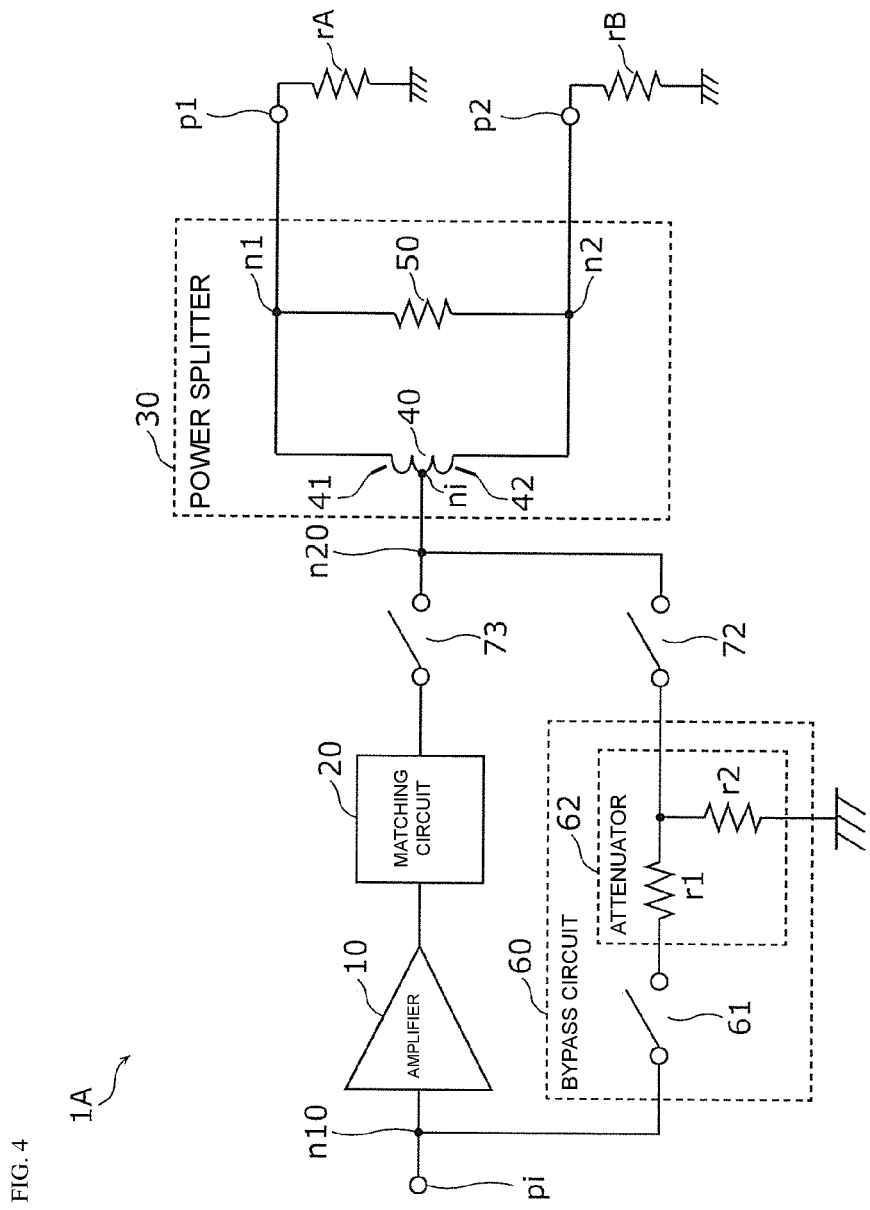
FIG. 4 is a circuit configuration diagram of a radio-frequency circuit according to Embodiment 2.

The following describes a radio-frequency circuit 1A according to Embodiment 2 with reference to FIG. 4. The radio-frequency circuit 1A according to Embodiment 2 includes a bypass circuit 60, which bypasses the amplifier 10 and the matching circuit 20.

FIG. 4 is a circuit configuration diagram of the radio-frequency circuit 1A according to Embodiment 2.

Referring to FIG. 4, the radio-frequency circuit 1A includes the amplifier 10, the matching circuit 20, the power splitter 30, the bypass circuit 60, a second switch 72, and a third switch 73. Instead of being sent to the amplifier 10, a large signal input to the input port pi may be sent to the bypass circuit 60, which causes the signal to bypass the amplifier 10 and outputs the signal to the power splitter 30. The output side of the power splitter 30 is connected with the radio-frequency loads rA and rB.

The bypass circuit 60 is connected parallel to the amplifier 10 and the matching circuit 20. The bypass circuit 60 includes a first switch 61 and an attenuator 62, which are arranged in series on a path connecting a node n10 on the input side of the amplifier 10 to a node n20 on the input side of the power splitter 30.

Specifically, the first switch 61 is connected to the node n10 located between the input port pi and the amplifier 10. The first switch 61 is, for example, a switching element, such as a field effect transistor.

The attenuator 62 is connected to the node n20 located between the matching circuit 20 and the power splitter 30. The attenuator 62 includes a first resistor r1 and a second resistor r2, whose resistance value is greater than the resistance value of the first resistor r1. The first resistor r1 is disposed on a path connecting the first switch 61 to the node located on the input side of the power splitter 30. One end of the second resistor r2 is connected to a node located between the first resistor r1 and the power splitter 30, and the other end of the second resistor r2 is connected to the ground. More specifically, the first resistor r1 is disposed on the path connecting the first switch 61 to the second switch 72, which will be described later, and the second resistor r2 is disposed between the ground and the node located on the path connecting the first resistor r1 to the second switch 72.

Various effects may be attained by adjusting, as appropriate, the resistance value of the first resistor r1 and the resistance value of the second resistor r2. The resistance value of the first resistor r1 may be greater than the resistance value of the second resistor r2. In this case, the impedance at the node on the output side of the attenuator 62 is typically lower than the impedance at the node on the input side of the attenuator 62. This facilitates the impedance matching between the bypass circuit 60 and the power splitter 30. The resistance value of the first resistor r1 may be smaller than the resistance value of the second resistor r2. In this case, the first resistor r1 typically has a smaller resistance value. Radio-frequency signals are transmitted through the bypass circuit 60 disposed on the path connected with the first resistor r1. Consequently, the insertion loss of the attenuator 62 may be reduced.

On the path on which the bypass circuit 60 is disposed, the second switch 72 is connected between the attenuator 62 and the node on the input side of the power splitter 30. The second switch 72 enables switching between presence and absence of electrical continuity between the attenuator 62 and the power splitter 30.

On the path on which the amplifier 10 and the matching circuit 20 are disposed, the third switch 73 is connected between the matching circuit 20 and the node on the input side of the power splitter 30. The third switch 73 enables switching between presence and absence of electrical continuity between the matching circuit 20 and the power splitter 30.

The first switch 61, the second switch 72, and the third switch 73 perform the switching between presence and absence of electrical continuity in a manner so as to switch between paths through which radio-frequency signals in the radio-frequency circuit 1 are transmitted. Specifically, radio-frequency signals are amplified by the amplifier 10 when the first switch 61 and the second switch 72 are off and the third switch 73 is on. Radio-frequency signals are transmitted through the bypass circuit 60 to bypass the amplifier 10 instead of being amplified by the amplifier 10 when the first switch 61 and the second switch 72 are on and the third switch 73 is off.

The impedance seen looking toward the input side of the power splitter 30 from the output side of the attenuator 62 is matched to the impedance seen looking toward the output side of the attenuator 62 from the input side of the power splitter 30. The impedance seen looking toward the input side of the power splitter 30 from the output side of the attenuator 62 is, for example, 25Ω. In this case, the impedance seen looking toward the output side of the attenuator 62 from the input side of the power splitter 30 is 25Ω.

In the present embodiment, the impedance seen looking toward the input side of the power splitter 30 from the output side of the attenuator 62 is matched to the impedance seen looking toward the output side of the attenuator 62 from the input side of the power splitter 30. Furthermore, the aforementioned impedances are matched to the value of the parallel impedance constituted of the first output-side impedance seen looking toward the radio-frequency load rA from the output side of the first line 41 of the power splitter 30 and the second output-side impedance seen looking toward the radio-frequency load rB from the output side of the second line 42 of the power splitter 30. The attenuator 62 may thus be used as an impedance matching circuit that provides impedance matching between the bypass circuit 60 and the power splitter 30. Such an attenuator typically included in a bypass circuit may be used to provide impedance matching between the bypass circuit 60 and the power splitter 30 without necessarily the need for an additional matching circuit. A further reduction in the size of the radio-frequency circuit 1A may thus be achieved.

When the amplifier 10, the matching circuit 20, and the power splitter 30 are electrically continuous so as to enable the amplifier 10 to amplify signals, that is, when the first switch 61 is set to off and the third switch 73 is set to on, the second switch 72 may be set to off so that the electrical continuity between the power splitter 30 and the attenuator 62 is disrupted. This can reduce interference with the impedance matching provided between the amplifier 10 and the power splitter 30 by the matching circuit 20. That is, the impedance matching between the amplifier 10 and the power splitter 30 may be further facilitated.

When the bypass circuit 60 and the power splitter 30 are electrically continuous so as to enable signals to bypass the amplifier 10 instead of being amplified by the amplifier 10, that is, when the first switch 61 and the second switch are set to on, the third switch 73 may be set to off so that the electrical continuity between the power splitter 30 and the matching circuit 20 is disrupted. This can stop interference with the impedance matching provided between the bypass circuit 60 and the power splitter 30 by the attenuator 62. That is, the impedance matching between the bypass circuit 60 and the power splitter 30 may be further facilitated.

Embodiment 3

Figure 5:
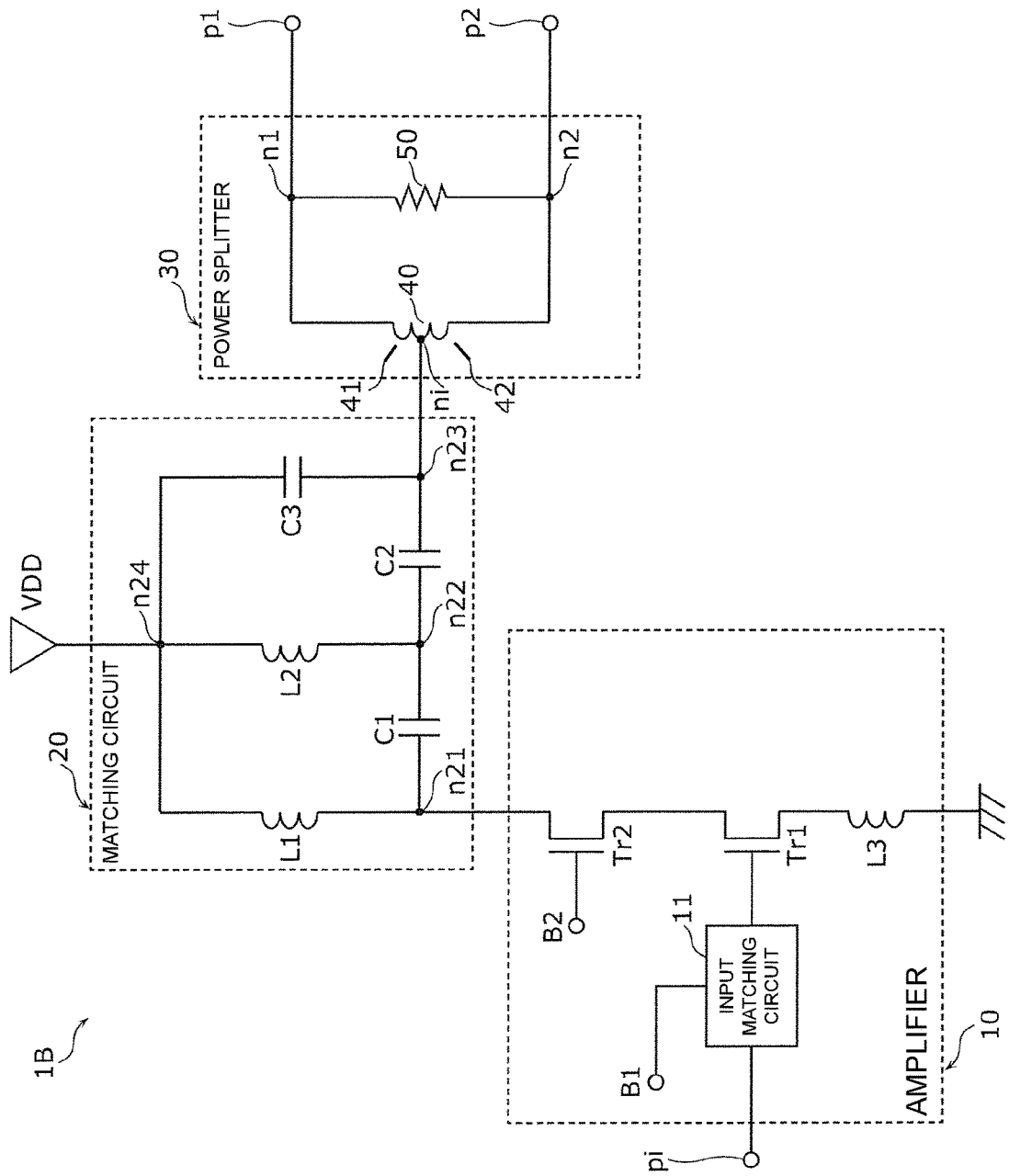
FIG. 5 is a circuit configuration diagram of a radio-frequency circuit according to Embodiment 3.

The following describes a radio-frequency circuit 1B according to Embodiment 3 with reference to FIG. 5. The matching circuit 20 of the radio-frequency circuit 1B according to Embodiment 3 includes a plurality of inductors.

FIG. 5 is a circuit configuration diagram of the radio-frequency circuit 1B according to Embodiment 3. The radio-frequency load connected to the first output port p1 and the radio-frequency load connected to the second output port p2 are omitted from FIG. 5. The circuit configuration of the amplifier 10 and the circuit configuration of the matching circuit 20 will be described below with reference to FIG. 5.

The amplifier 10 includes, for example, a transistor Tr1 and a transistor Tr2 in cascode connection. Radio-frequency signals input to the amplifier 10 through the input port pi are amplified by the transistors Tr1 and Tr2. The transistors Tr1 and Tr2 are n-type field effect transistors. In some embodiments, the transistors Tr1 and Tr2 may be p-type field effect transistors or bipolar transistors.

The gate of the transistor Tr1 is connected with an input matching circuit 11. The input matching circuit 11 is connected with a bias terminal B1 for application of bias voltage. The source of the transistor Tr1 is connected to a ground terminal through an inductor L3. The drain of the transistor Tr1 is connected with the source of the transistor Tr2. The gate of the transistor Tr2 is connected with a bias terminal B2. The drain of the transistor Tr2 is connected with the matching circuit 20.

The radio-frequency circuit 1B includes a voltage input terminal VDD, through which voltage is applied to the amplifier 10.

The matching circuit 20 includes a capacitor C1 and a capacitor C2, which are arranged in series on a path connecting the amplifier 10 to the power splitter 30. The capacitors C1 and C2 are matching elements for providing impedance matching and are also DC-cutting capacitors.

The matching circuit 20 also includes an inductor L1 and an inductor L2, which are connected between the amplifier 10 and the voltage input terminal VDD and connected in parallel to the voltage input terminal VDD. The inductors L1 and L2 are connected to each other at a node n24, which is located between the voltage input terminal VDD, and the inductor L1 and the inductor L2. The inductors L1 and L2 are elements for providing impedance matching and are also choke coils.

The inductor L1 is connected to a node n21, which is located between the amplifier 10 and the capacitor C1 closer than any other capacitor to the amplifier 10. The inductor L2 is connected to a node n22, which is located between the capacitors C1 and C2 adjacent to each other.

The matching circuit 20 also includes a capacitor C3, which is for use in providing impedance matching and is located between the voltage input terminal VDD and a node n23 between the capacitor C2 and the power splitter 30.

The matching circuit 20 according to Embodiment 3 includes a plurality of impedance elements (e.g., the inductors L1 and L2 or capacitors) connected in parallel to the voltage input terminal VDD. The matching circuit 20 can thus provide impedance matching over a wider frequency range, and the radio-frequency circuit 1B may be adapted to a wider band accordingly. Unlike a matching circuit including one inductor, the matching circuit configured as described above can provide impedance matching without necessarily the need to reduce the value of inductance and thus eliminates or reduces the possibility that the gain of the amplifier 10 will be lowered. Although the matching circuit 20 in Embodiment 3 involves an increase in the number of matching elements, the adoption of the power splitter 30 in Embodiment 1 will be instrumental in minimizing the increase in the size of the radio-frequency circuit 1B as a whole.

OTHER EMBODIMENTS

The radio-frequency circuits 1 to 1B according to embodiments of the present disclosure have been described so far. It should be noted that the present disclosure is not limited to the embodiments above. The present disclosure embraces modifications achieved through the following alterations to the embodiments above.

The radio-frequency circuit 1 may be incorporated in a communication device. Such a communication device may be constituted of the radio-frequency circuit 1, a filter connected to the input port pi of the radio-frequency circuit 1, and signal processing circuits, such as an RF signal processing circuit (RFIC) and a baseband signal processing circuit (BBIC) that are provided to the first output port p1 and the second output port p2, respectively.

The radio-frequency circuit 1 may be incorporated in a communication device that transmits and receives signals in accordance with the IEEE 802.11 standard or a standard other than IEEE 802.11 (e.g., the LTE standard or the W-CDMA standard).

The power splitter 30 may be formed in a low-temperature co-fired ceramic (LTCC) production process instead of being formed in a semiconductor process. In this case, conductive paste that is to be formed into lines is applied to ceramic green sheets, which are then stacked together and fired to obtain the power splitter 30. Alternatively, the power splitter 30 may be prepared with a printed circuit board. In this case, the power splitter 30 is constituted of traces arranged on the printed circuit board.

INDUSTRIAL APPLICABILITY

The present disclosure, or more specifically, a radio-frequency circuit that minimizes power loss of radio-frequency signals has wide applicability to communication devices. Furthermore, the radio-frequency circuit is miniaturized and thus has wide applicability to communication devices.

REFERENCE SIGNS LIST 1, 1A, 1B radio-frequency circuit
10 amplifier
11 input matching circuit
20 matching circuit
30 power splitter
40 differential inductor
41 first line
41a upper line
41b lower line
41c via conductor
42 second line 42a upper line
42b lower line
42c via conductor
50 resistor element
60 bypass circuit
61 first switch
62 attenuator
72 second switch
73 third switch
B1, B2 bias terminal
C1, C2, C3 capacitor
J coil axis
L1, L2, L3 inductor
ni input node
n1, n2, n10, n20, n21, n22, n23, n24 node
pi input port
p1 first output port
p2 second output port
r1 first resistor
r2 second resistor
rA, rB radio-frequency load
s1, s2, s3, s4, s5, s6, s7 layer
Tr1, Tr2 transistor
VDD voltage input terminal

The invention claimed is:

1. A radio-frequency circuit comprising:
an amplifier;
a matching circuit connected to an output side of the amplifier; and
a power splitter connected to an output side of the matching circuit, wherein
the power splitter includes
a differential inductor including an input node, a first line, and a second line, the input node being connected to the matching circuit, the first and second lines being respectively wound into a coil form and connected to the input node, and
a first resistor forming a connection between a first node on an output side of the first line and a second node on an output side of the second line,
wherein the first and second lines are wound in opposite directions and have the same coil axis, and
wherein the power splitter is formed on a semiconductor integrated circuit.

2. The radio-frequency circuit according to claim 1, wherein the first and second lines include at least one cross portion where the first and second lines cross each other.

3. The radio-frequency circuit according to claim 1, wherein the amplifier, the matching circuit, and the power splitter are integrated into the semiconductor integrated circuit.

4. The radio-frequency circuit according to claim 2, wherein the amplifier, the matching circuit, and the power splitter are integrated into the semiconductor integrated circuit.

5. The radio-frequency circuit according to claim 1, wherein
a radio-frequency load is connected to an output side of the power splitter, and
a first impedance seen looking toward an input side of the power splitter from the output side of the matching circuit is a parallel impedance constituted of a second impedance seen looking toward the radio-frequency load from the output side of the first line of the power splitter and a third impedance seen looking toward the radio-frequency load from the output side of the second line of the power splitter, and the first impedance is matched to a fourth impedance seen looking toward the output side of the matching circuit from the input side of the power splitter.

6. The radio-frequency circuit according to claim 2, wherein
a radio-frequency load is connected to an output side of the power splitter, and
a first impedance seen looking toward an input side of the power splitter from the output side of the matching circuit is a parallel impedance constituted of a second impedance seen looking toward the radio-frequency load from the output side of the first line of the power splitter and a third impedance seen looking toward the radio-frequency load from the output side of the second line of the power splitter, and the first impedance is matched to a fourth impedance seen looking toward the output side of the matching circuit from the input side of the power splitter.

7. The radio-frequency circuit according to claim 3, wherein
a radio-frequency load is connected to an output side of the power splitter, and
a first impedance seen looking toward an input side of the power splitter from the output side of the matching circuit is a parallel impedance constituted of a second impedance seen looking toward the radio-frequency load from the output side of the first line of the power splitter and a third impedance seen looking toward the radio-frequency load from the output side of the second line of the power splitter, and the first impedance is matched to a fourth impedance seen looking toward the output side of the matching circuit from the input side of the power splitter.

8. The radio-frequency circuit according to claim 1, further comprising:
a bypass circuit that bypasses the amplifier and the matching circuit and includes a first switch and an attenuator;
a second switch; and
a third switch, wherein
the first switch and the attenuator are arranged in series on a path connecting a seventh node on an input side of the amplifier to a eighth node on an input side of the power splitter, the first switch is connected to the seventh node on the input side of the amplifier,
the attenuator is connected to the eighth node on the input side of the power splitter,
on a path on which the bypass circuit is disposed, the second switch is connected between the attenuator and the eighth node on the input side of the power splitter,
on a path on which the amplifier and the matching circuit are disposed, the third switch is connected between the matching circuit and the eighth node on the input side of the power splitter, and
a fifth impedance seen looking toward the input side of the power splitter from an output side of the attenuator is matched to a sixth impedance seen looking toward the output side of the attenuator from the input side of the power splitter.

9. The radio-frequency circuit according to claim 8, wherein the bypass circuit is connected parallel to the amplifier and the matching circuit.

10. The radio-frequency circuit according to claim 8, wherein the attenuator includes a second resistor and a third resistor, wherein a resistance value of the third resistor is greater than a resistance value of the second resistor.

11. The radio-frequency circuit according to claim 10, wherein the second resistor is disposed on a path connecting the first switch to the second node located on the input side of the power splitter.

12. The radio-frequency circuit according to claim 10, wherein the second resistor is disposed on a path connecting the first switch to the second switch.

13. The radio-frequency circuit according to claim 10, wherein a first end of the third resistor is connected to a third node located between the second resistor and the power splitter, and a second end of the third resistor is connected to ground.

14. The radio-frequency circuit according to claim 10, wherein the third resistor is disposed between ground and a fourth node located on the path connecting the second resistor to the second switch.

15. The radio-frequency circuit according to claim 1, further comprising a voltage input terminal through which voltage is applied to the amplifier, wherein
the matching circuit includes a plurality of capacitors arranged in series on a path connecting the amplifier to the power splitter, and a plurality of inductors connected between the amplifier and the voltage input terminal and connected in parallel to the voltage input terminal,
a first inductor of the plurality of inductors is connected to a fifth node located between the amplifier and one capacitor of the plurality of capacitors that is closest to the amplifier, and
a second inductor of the plurality of inductors is connected to a sixth node located between adjacent capacitors of the plurality of capacitors.

16. The radio-frequency circuit according to claim 2, further comprising a voltage input terminal through which voltage is applied to the amplifier, wherein
the matching circuit includes a plurality of capacitors arranged in series on a path connecting the amplifier to the power splitter, and a plurality of inductors connected between the amplifier and the voltage input terminal and connected in parallel to the voltage input terminal,
a first inductor of the plurality of inductors is connected to a third node located between the amplifier and one capacitor of the plurality of capacitors that is closest to the amplifier, and
a second inductor of the plurality of inductors is connected to a sixth node located between adjacent capacitors of the plurality of capacitors.

17. The radio-frequency circuit according to claim 3, further comprising a voltage input terminal through which voltage is applied to the amplifier, wherein
the matching circuit includes a plurality of capacitors arranged in series on a path connecting the amplifier to the power splitter, and a plurality of inductors connected between the amplifier and the voltage input terminal and connected in parallel to the voltage input terminal,
a first inductor of the plurality of inductors is connected to a third node located between the amplifier and one capacitor of the plurality of capacitors that is closest to the amplifier, and
a second inductor of the plurality of inductors is connected to a sixth node located between adjacent capacitors of the plurality of capacitors.

18. The radio-frequency circuit according to claim 1, wherein the amplifier is a low noise amplifier.

19. The radio-frequency circuit according to claim 2, wherein the amplifier is a low noise amplifier.

20. The radio-frequency circuit according to claim 3, wherein the amplifier is a low noise amplifier.

* * * * *